United States Patent
Lu et al.

(10) Patent No.: US 8,227,915 B2
(45) Date of Patent: Jul. 24, 2012

(54) BUMP STRUCTURE, CHIP PACKAGE STRUCTURE INCLUDING THE SAME AND METHOD OF MANUFACTURING THE SAME

(75) Inventors: Su Tsai Lu, Hsinchu (TW); Yu Wei Huang, Fengyuan (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 279 days.

(21) Appl. No.: 12/647,068

(22) Filed: Dec. 24, 2009

(65) Prior Publication Data

US 2011/0079895 A1 Apr. 7, 2011

(30) Foreign Application Priority Data

Oct. 2, 2009 (TW) ................. 98133500 A

(51) Int. Cl.
 *H01L 23/48* (2006.01)
 *H01L 23/52* (2006.01)
(52) U.S. Cl. .............. 257/737; 257/778; 257/E23.021
(58) Field of Classification Search ........... 257/737, 257/778, E23.021

See application file for complete search history.

(56) References Cited

U.S. PATENT DOCUMENTS

| | | | |
|---|---|---|---|
| 5,448,114 A * | 9/1995 | Kondoh et al. | 257/778 |
| 6,586,843 B2 * | 7/2003 | Sterrett et al. | 257/778 |
| 7,000,821 B2 * | 2/2006 | Sterrett et al. | 228/180.22 |
| 7,098,518 B1 * | 8/2006 | Mostafazadeh et al. | 257/433 |
| 7,109,058 B2 | 9/2006 | Yamada et al. | |
| 7,750,469 B2 * | 7/2010 | Cho et al. | 257/738 |
| 2003/0087475 A1 * | 5/2003 | Sterrett et al. | 438/108 |
| 2005/0227475 A1 | 10/2005 | Chen et al. | |
| 2005/0258539 A1 * | 11/2005 | Minda | 257/738 |
| 2007/0063347 A1 | 3/2007 | Su | |
| 2010/0140752 A1 * | 6/2010 | Marimuthu et al. | 257/621 |

* cited by examiner

*Primary Examiner* — Nitin Parekh
(74) *Attorney, Agent, or Firm* — Egbert Law Offices PLLC

(57) ABSTRACT

A bump structure includes a first substrate, a plurality of first bond pads, a plurality of dielectric bumps, a plurality of under bump metal layers, and a plurality of metal layers. The plurality of first bond pads are spaced apart on the first substrate. The plurality of dielectric bumps disposed corresponding to the first bond pads electrically isolate the first bond pads from each other. Each under bump metal layer is formed between the respective first bond pad and the dielectric bump, extending through a side surface of the respective dielectric bump, and correspondingly forming an extension portion between two adjacent dielectric bumps, wherein each extension portion has a length along the extending direction thereof shorter than the pitch between two adjacent dielectric bumps. Each metal layer is formed on the side surface of the respective dielectric bump and the respective extension portion.

13 Claims, 11 Drawing Sheets

BUMP STRUCTURE, CHIP PACKAGE STRUCTURE INCLUDING THE SAME AND METHOD OF MANUFACTURING THE SAME

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present disclosure relates to a fine pitch chip package structure and a bump structure thereof.

2. Description of Related Art Including Information Disclosed Under 37 CFR 1.97 and 37 CFR 1.98

As display panel technology is improved to provide higher resolution and higher-quality images, the number of bond pads for driving pixels necessarily increases. Correspondingly, as such increasing numbers of bond pads are placed on driving chips of ever-diminishing size, the research in chip on glass package technology or chip on flex package technology for driving chips of liquid crystal modules has focused on fine pitch chip package technology.

Generally, in a liquid crystal module, driving chips are attached to the display panel using an adhesive material as a middle layer, wherein the adhesive material can be an anisotropic conductive adhesive or a non-conductive adhesive. However, when driving chips are bonded using a fine pitch technology and an anisotropic conductive adhesive as a middle layer, conductive particles may easily aggregate between bumps, resulting in a bridging issue causing shortage of bond pads due to the pitch of the bumps being less than 10 micrometers. To solve the bridging issue, different technologies have been developed.

U.S. Patent Publication No. 2007/0,063,347 discloses a type of conductive particle. Each of the conductive particles is enclosed by an insulative layer, thereby electrically isolating the aggregate conductive particles from each other.

U.S. Patent Publication No. 2005/0,227,475 discloses a method using an electrophoresis technology to control the distribution of conductive particles on the bond pads of a chip.

U.S. Pat. No. 7,109,058 discloses a semiconductor device without bumps thereon and a method for fabricating the same. The method attaches conductive particles to bond pads using an ultrasonic welding technology.

Aside from the above issues, as the density of bond pads increases, the bumps for connecting the bond pads become correspondingly smaller. With smaller bumps, the number of trapped conductive particles is smaller, reducing the quality of the connection between the bumps and the bond pads.

In summary, the chip package technology faces a fine pitch chip package challenge, and therefore a new bond pad bonding structure and method that can overcome the above-mentioned issues are required.

BRIEF SUMMARY OF THE INVENTION

One embodiment of the present disclosure proposes a bump structure, which comprises a first substrate, a plurality of first bond pads, a plurality of dielectric bumps, a plurality of under bump metal layers, and a plurality of metal layers. The plurality of first bond pads are disposed on the first substrate. The plurality of dielectric bumps are disposed corresponding to the first bond pads, and the plurality of dielectric bumps electrically isolate the respective first bond pads from each other. Each under bump metal layer is correspondingly formed between the first bond pad and the dielectric bump, extending through a side surface of the respective dielectric bump, and forming an extension portion between an adjacent two of the dielectric bumps, wherein each extension portion has a length along the extending direction thereof less than the pitch between the two adjacent dielectric bumps.

Another embodiment of the present disclosure proposes a bump structure, which comprises a first substrate, a plurality of dielectric bumps, a plurality of first bond pads, and a plurality of metal layers. The plurality of dielectric bumps are disposed on the first substrate, each having opposite side surfaces, wherein at least one of the side surfaces of each dielectric bumps faces toward an adjacent one of the dielectric bumps. Each first bond pad is disposed respectively between an adjacent two of the dielectric bumps. Each metal layer is formed on the respective first bond pad and the side surfaces of the dielectric bumps adjacent to the first bond pad.

One embodiment of the present disclosure proposes a chip package structure, which comprises a first substrate, a plurality of first bond pads, a plurality of dielectric bumps, a plurality of under bump metal layers, and a plurality of metal layers. The plurality of first bond pads are disposed on the first substrate. The plurality of dielectric bumps are disposed corresponding to the first bond pads, wherein the plurality of dielectric bumps electrically isolate the respective first bond pads from each other. Each under bump metal layer is correspondingly formed between the first bond pad and the dielectric bump, extending through a side surface of the respective dielectric bump, and forming an extension portion between an adjacent two of the dielectric bumps, wherein each extension portion has a length along the extending direction thereof less than the pitch between the two adjacent dielectric bumps. Each metal layer is formed on the side surface of the respective dielectric bump and the respective extension portion. The plurality of second bond pads are disposed on the second substrate with respect to the first bond pads, wherein the second bond pad is configured to protrude between the two adjacent dielectric bumps. The conductive adhesive includes a plurality of conductive particles, and the conductive adhesive is disposed between the first substrate and the second substrate, wherein a portion of the conductive particles are trapped between the second bond pads and the metal layers.

Another embodiment of the present disclosure proposes a chip package structure, which comprises a first substrate, a plurality of dielectric bumps, a plurality of first bond pads, a plurality of metal layers, a second substrate, a plurality of second bond pads, and a conductive adhesive. The plurality of dielectric bumps are disposed on the first substrate, each having opposite side surfaces, wherein at least one of the side surfaces of each dielectric bumps faces toward an adjacent one of the dielectric bumps. Each first bond pad is disposed respectively between an adjacent two of the dielectric bumps. Each metal layer is formed on the respective first bond pad and the side surfaces of the dielectric bumps adjacent to the first bond pad. The plurality of second bond pads are disposed on the second substrate with respect to the first bond pads, and the second bond pad is configured to protrude between the two adjacent dielectric bumps. The conductive adhesive includes a plurality of conductive particles, and the conductive adhesive is disposed between the first substrate and the second substrate, wherein a portion of the conductive particles are trapped between the second bond pads and the metal layers.

One embodiment of the present disclosure proposes a method of manufacturing a bump structure, which comprises the steps of: providing a first substrate; forming a plurality of first bond pads on the first substrate; forming an under bump metal layer on the first substrate; forming a plurality of dielectric bumps on the under bump metal layer with respect to the plurality of first bond pads; forming a metal layer on the under bump metal layer and the plurality of dielectric bumps; forming a corresponding plurality of mask layers between the plurality of dielectric bumps, wherein each mask layer covers a portion of the metal layer on a side surface of the dielectric bump and a portion of the metal layer between the two adjacent dielectric bumps; and removing unmasked portions of the metal layer and the under bump metal layer.

Another embodiment of the present disclosure proposes a method of manufacturing a bump structure, which comprises the steps of: providing a first substrate; forming a plurality of first bond pads on the first substrate; forming a corresponding plurality of under bump metal layers on the plurality of first bond pads, wherein the plurality of under bump metal layers are electrically isolated from each other; forming a corresponding plurality of dielectric bumps on the plurality of under bump metal layers, wherein a portion of each under bump metal layer is between an adjacent two of the dielectric bumps; forming a metal layer on the plurality of dielectric bumps and the portions of the under bump metal layers; and removing portions of the metal layer from the tops of the dielectric bumps.

Another embodiment of the present disclosure proposes a method of manufacturing a bump structure, which comprises the steps of: providing a first substrate; forming a plurality of first bond pads on the first substrate; forming a plurality of dielectric bumps on the first substrate, wherein the first bond pads are respectively between the plurality of dielectric bumps; forming a metal layer on the plurality of dielectric bumps and the plurality of first bond pads; and removing portions of the metal layer from the tops of the dielectric bumps.

To better understand the above-described characteristics of the present disclosure, embodiments, with reference to the drawings, are provided for detailed explanations.

BRIEF DESCRIPTION OF THE SEVERAL VIEWS OF THE DRAWINGS

The disclosure will be described according to the appended drawings in which.

DETAILED DESCRIPTION OF THE INVENTION

Figure 1:
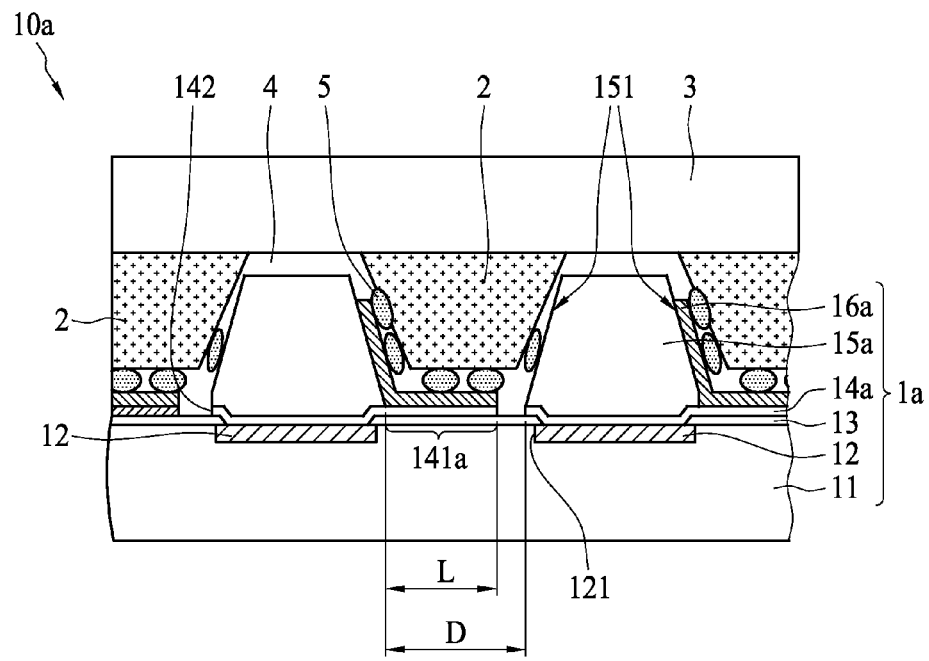
FIG. 1 is a cross-sectional view showing a chip package structure according to the first exemplary embodiment of the present disclosure.

FIG. 1 is a cross-sectional view showing a chip package structure 10a according to the first embodiment of the present disclosure. The chip package structure 10a of the present disclosure comprises a second substrate 3 comprised of a plurality of second bond pads 2 and a bump structure 1a. The bump structure 1a comprises a first substrate 11, a plurality of first bond pads 12, a passive layer 13, a plurality of under bump metal (UBM) layers 14a, a plurality of dielectric bumps 15a, and a plurality of metal layers 16a. The plurality of first bond pads 12 are disposed on the first substrate 11, and the first bond pads 12 are arranged in a fine pitch manner in the present embodiment of the disclosure. The passive layer 13 is formed around the plurality of the first bond pads 12. The plurality of UBM layers 14a are correspondingly formed on the plurality of first bond pads 12, wherein each UBM layer 14a extends in a direction away from an edge 121 of the respective first bond pad 12.

The plurality of dielectric bumps 15a are correspondingly formed on the plurality of first bond pads 12. Each dielectric bump 15a covers the edge 121 of the respective first bond pad 12. Each UBM layer 14a extends through the side surface 151 of the respective dielectric bump 15a facing slightly upward, forming an extension portion 141a between two adjacent dielectric bumps 15a, wherein each extension portion 141a has a length L less than the corresponding pitch D between the two adjacent dielectric bumps 15a. In addition, in each UBM layer 14a, the edge 142 opposed to the extension portion 141a can be covered by the respective dielectric bump 15a. Because the extension portion 141a of each UBM layer 14a does not extend to the next dielectric bump 15a, the plurality of UBM layers 14a are electrically isolated from each other.

Each dielectric bump 15a includes two opposite side surfaces 151 inclined to face slightly upward. The plurality of metal layers 16a are disposed with respect to the plurality of dielectric bumps 15a. Each metal layer 16a is disposed on the side surface 151 of the respective dielectric bump 15a where the UBM layer 14a extends through, and on the respective extension portion 141a between the respective adjacent dielectric bumps 15a.

The bump structure 1a is configured to bond to the plurality of second bond pads 2 having a bump-like shape and formed on the second substrate 3. Each second bond pad 2 may have a cross-sectional configuration matched with the contour defined by two adjacent dielectric bumps 15a. Thus, when the second bond pad 2 is correspondingly inserted between two adjacent dielectric bumps 15a, the side surfaces of the second bond pad 2 press the conductive particles 5 in the conductive adhesive 4 against the side surfaces 151 of the dielectric bumps 15a, and the top surface of the second bond pad 2 presses the conductive particles against the extension portions 141a. The dielectric bump 15a can have sufficient height so as to prevent the aggregation of conductive particles 5 between two adjacent second bond pads 2 and to avoid the bridging issue. Further, the metal layer 16a electrically connected to the first bond pad 12 disposed on one side surface 151 of the dielectric bump 15a and between the dielectric bumps 15a has larger area to trap more conductive particles so as to lower the connection resistance.

Figure 2:
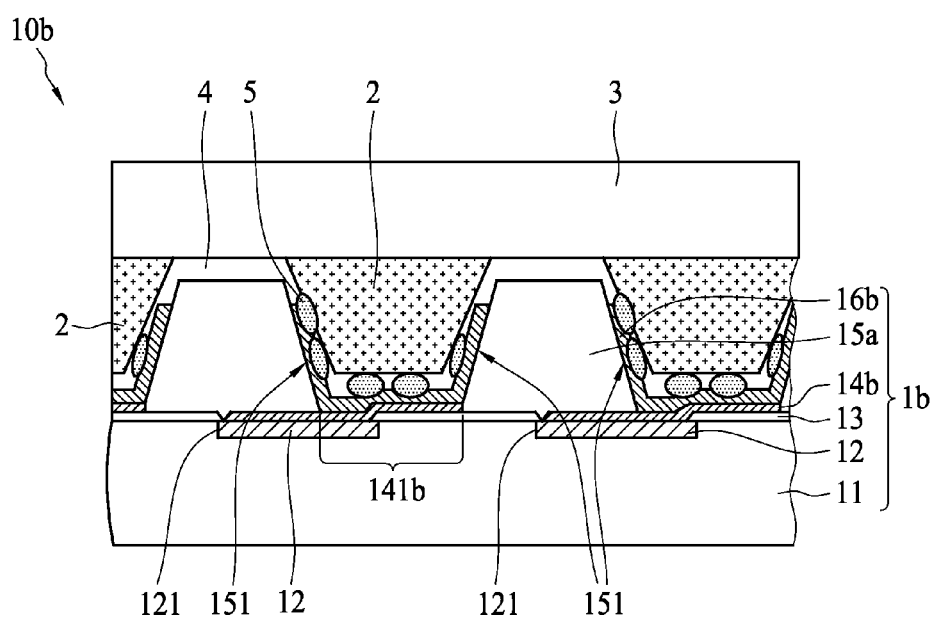
FIG. 2 is a cross-sectional view showing a chip package structure according to the second exemplary embodiment of the present disclosure.

FIG. 2 is a cross-sectional view showing a chip package structure 10b according to the second embodiment of the present disclosure. The chip package structure 10b of the embodiment comprises a second substrate 3 comprised of a plurality of second bond pads 2 and a bump structure 1b configured to place the plurality of second bond pads 2 therebetween for connection. The bump structure 1b comprises a first substrate 11, a plurality of first bond pads 12 disposed on the first substrate 11, a passive layer 13 surrounding the plurality of first bond pads 12, a plurality of UBM layers 14b, a plurality of dielectric bumps 15a, and a plurality of metal layers 16b. Each dielectric bump 15a covers an edge 121 of the respective first bond pad 12 so that the plurality of first bond pads 12 can be electrically isolated from each other. The plurality of UBM layers 14b are correspondingly formed on the first bond pad 12 and between the dielectric bumps 15a. Each UBM layer 14b extends in a direction away from an edge 121 of the respective first bond pad 12, extends through one side surface 151 of the dielectric bump 15a, and forms respectively an extension portion 141b between the adjacent dielectric bumps 15a. In the present embodiment, each dielectric bump 15a is deviated from the respective first bond pad 12 such that each extension portion 141b can extend to the next dielectric bump 15a and cannot electrically connect to the adjacent first bond pad 12. Each metal layer 16b can be respectively disposed on the side surfaces 151 of adjacent dielectric bumps 15a facing toward each other and on the respective extension portion 141b so that the trapping rate of conductive particles can be increased.

Figure 3:
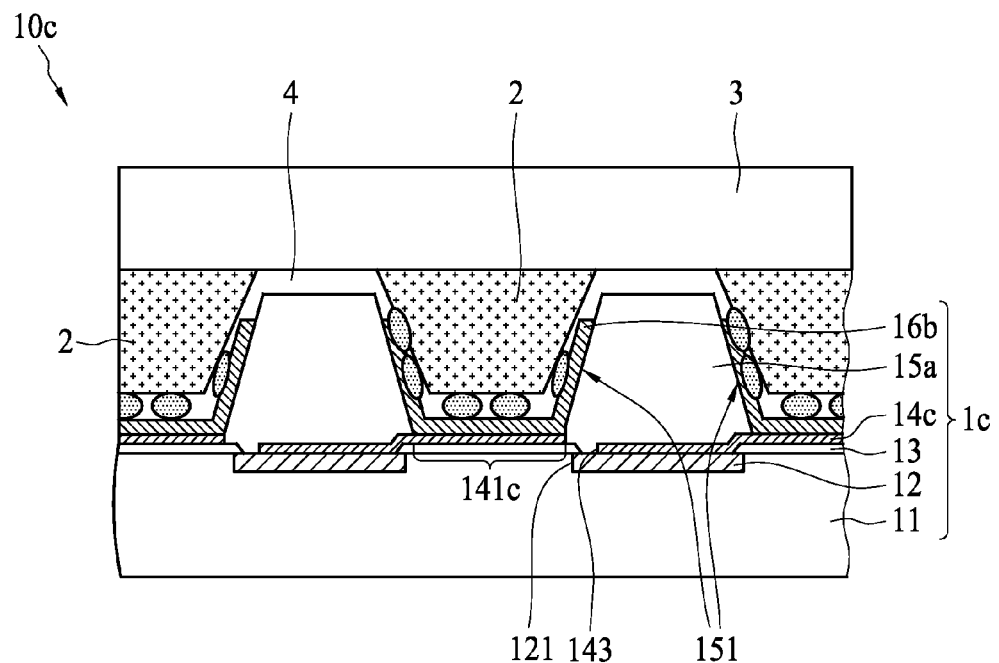
FIG. 3 is a cross-sectional view showing a chip package structure according to the third exemplary embodiment of the present disclosure.

FIG. 3 is a cross-sectional view showing a chip package structure 10c according to the third embodiment of the present disclosure. The chip package structure 10c of the present embodiment comprises a second substrate 3 comprised of a plurality of second bond pads 2 and a bump structure 1c configured to place the plurality of second bond pads 2 therebetween for connection. The bump structure 1c comprises a first substrate 11, a plurality of first bond pads 12 disposed on the first substrate 11, a passive layer 13 surrounding the plurality of first bond pads 12, a plurality of UBM layers 14c, a plurality of dielectric bumps 15a, and a plurality of metal layers 16b. Each dielectric bump 15a covers an edge 121 of the respective first bond pad 12 so that the plurality of first bond pads 12 can be electrically isolated from each other. The plurality of UBM layers 14c are correspondingly formed on the first bond pad 12 and between the dielectric bumps 15a. Each UBM layer 14c extends through one side surface 151 of the dielectric bump 15a, and forms a respective extension portion 141c between the adjacent dielectric bumps 15a. In the present embodiment, one edge 143 of each UBM layer 14c opposite the extension portion 141c is disposed below the respective dielectric bump 15a so that each extension portion 141c can extend to the next dielectric bump 15a and cannot electrically connect to the next UBM layer 14c. Each metal layer 16b can be respectively disposed on the side surfaces 151 of adjacent dielectric bumps 15a facing toward each other and on the respective extension portion 141c so that the trapping rate of conductive particles can be increased.

Figure 4:
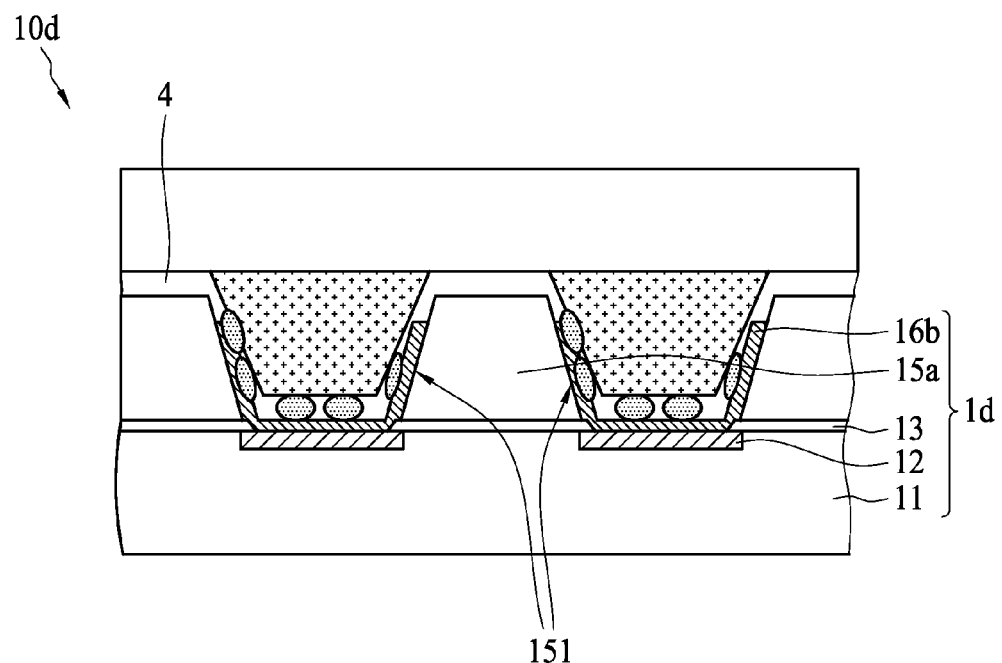
FIG. 4 is a cross-sectional view showing a chip package structure according to the fourth exemplary embodiment of the present disclosure.
Figure 5:
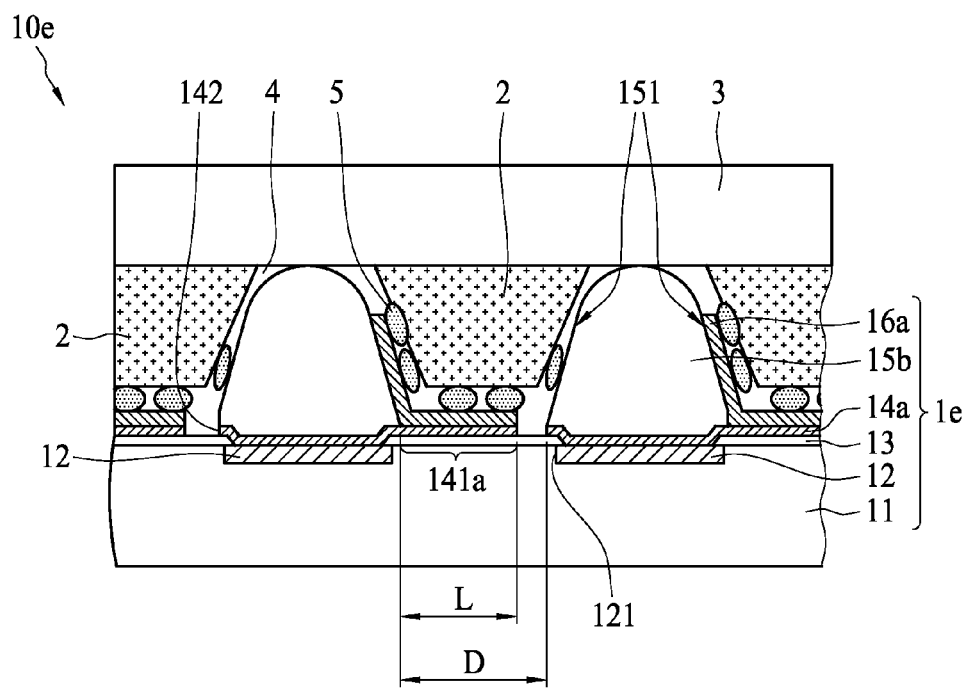
FIGS. 5 to 8 are cross-sectional views showing different chip package structures according to other exemplary embodiments of the present disclosure.
Figure 6:
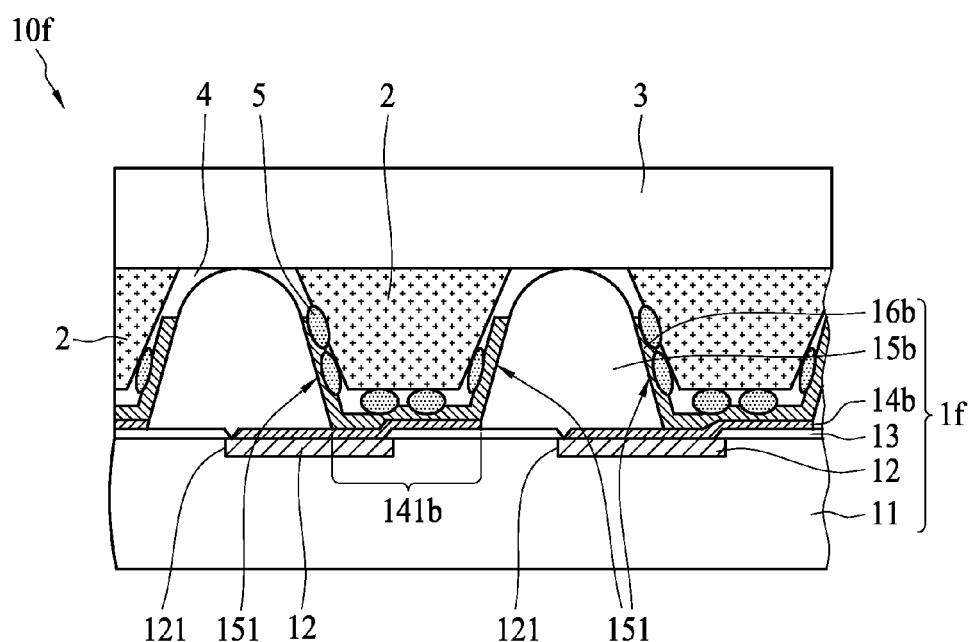
Figure 7:
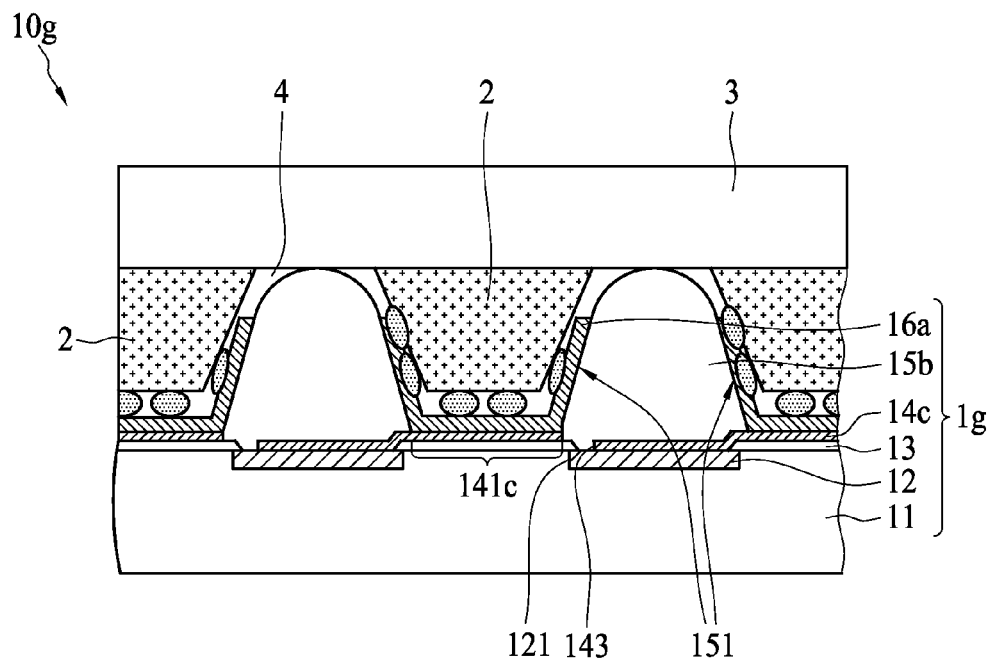
Figure 8:
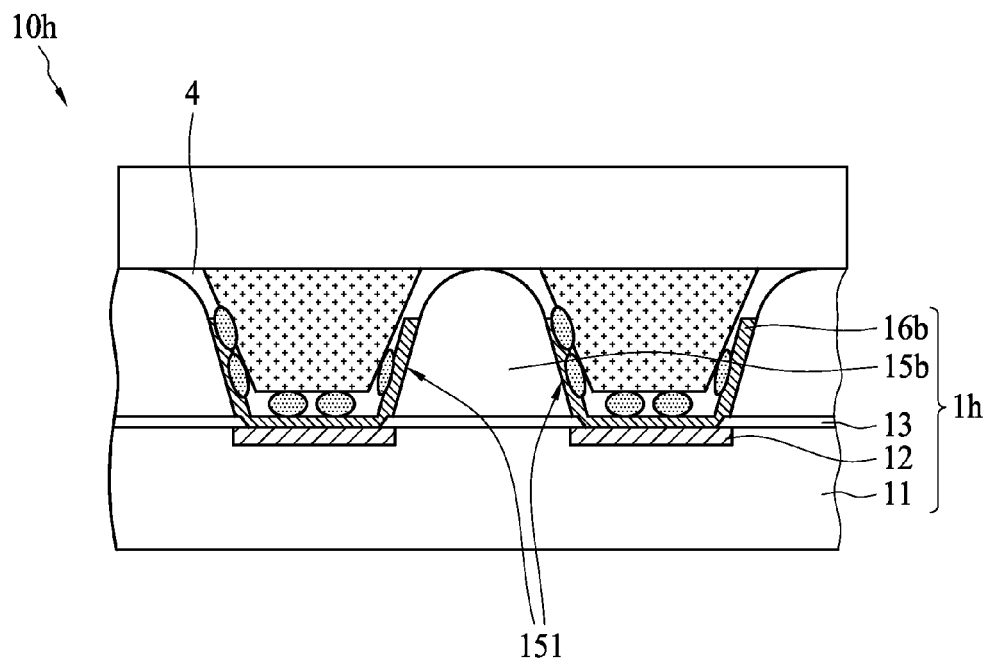

FIG. 4 is a cross-sectional view showing a chip package structure 10d according to the fourth embodiment of the present disclosure. The chip package structure 10d of the present embodiment comprises a second substrate 3 comprised of a plurality of second bond pads 2 and a bump structure 1d configured to place the plurality of second bond pads 2 therebetween for connection, which includes a first substrate 11, a plurality of first bond pads 12 on the first substrate 11, a passive layer 13 surrounding the plurality of first bond pads 12, a plurality of dielectric bumps 15a, and a plurality of metal layers 16b. The plurality of dielectric bumps 15a are formed on the first substrate 11. Each dielectric bump 15a can have two opposite and upward-inclined side surfaces 151, each of which may face toward one adjacent dielectric bump 15a. The plurality of first bond pads 12 are disposed correspondingly between the plurality of dielectric bumps 15a, and the plurality of metal layers 16b are correspondingly disposed the side surfaces 151 of two adjacent dielectric bumps facing toward each other and on the respective first bond pads 12.

FIGS. 5 to 8 are cross-sectional views showing different chip package structures 10e-10h according to other embodiments of the present disclosure. The chip package structures 10e-10h of the embodiments shown in FIGS. 5 to 8 have configurations respectively similar to those of the first to fourth embodiments. However, while the dielectric bump 15a in the first to fourth embodiments has a flat top, the dielectric bump 15b in the embodiments shown in FIGS. 5 to 8 has a round top. When the dielectric bump 15a has a flat top, a portion of conductive particles may be confined between the flat top of the dielectric bump 15a and the second substrate 3, and when the dielectric bump 15b has a round top, conductive particles can be moved to either side of the dielectric bump 15b and be efficiently divided.

Figure 9:
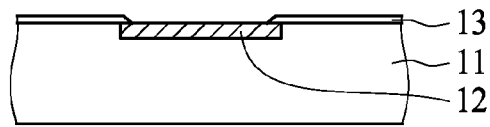
FIGS. 9 to 14 are cross-sectional views showing formation of a bump structure according to one exemplary embodiment of the present disclosure.
Figure 10:
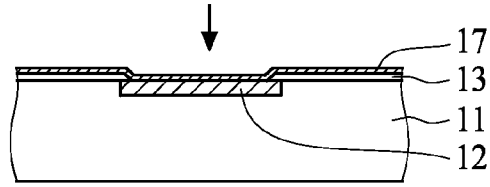
Figure 11:
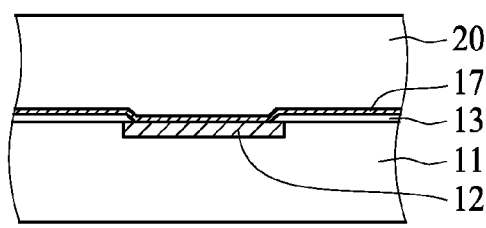
Figure 12:
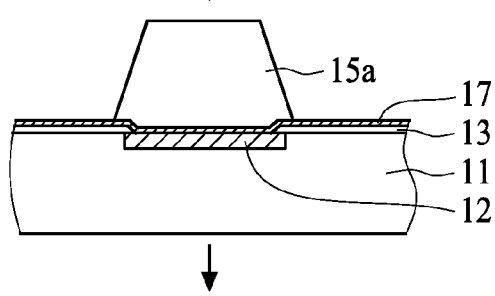
Figure 13:
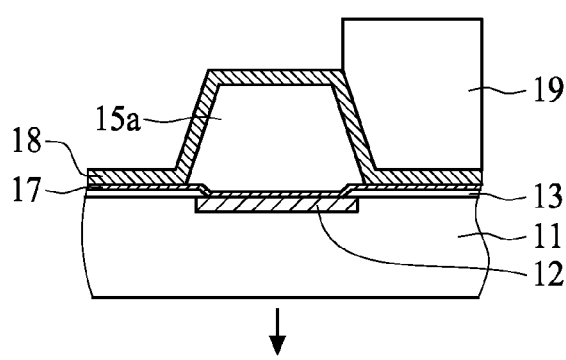
Figure 14:
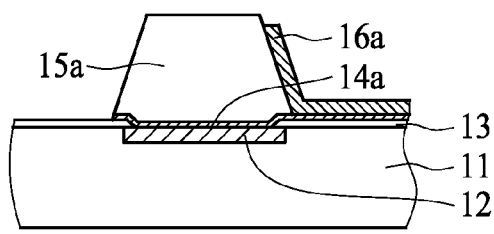

FIGS. 9 to 14 are cross-sectional views showing formation of a bump structure 1a according to one embodiment of the present disclosure. As shown in FIG. 9, a first substrate 11 is initially provided. Next, a plurality of first bond pads 12 are formed on the first substrate 11 in a well-spaced distribution. Next, a passive layer 13 is formed to surround each first bond pad 12. As shown in FIG. 10, a UBM layer 17 is then formed to cover the plurality of first bond pads 12 and the passive layer 13. Referring to FIGS. 11 and 12, a polymer layer 20 is thereafter formed on the UBM layer 17. Next, the polymer layer 20 is patterned so as to form a plurality of dielectric bumps 15a. Referring to FIG. 13, a metal layer 18 is then formed on the surface of the plurality of dielectric bumps 15a and the portions of the UBM layer 17 between the dielectric bumps 15a. Thereafter, a plurality of mask layers 19 are formed correspondingly between the plurality of dielectric bumps 15a, wherein each mask layer 19 covers a portion of the metal layer 18 on a side surface of the dielectric bump 15a and a portion of the metal layer 18 between the two adjacent dielectric bumps 15a. Between the dielectric bumps 15a, the masked metal layer 18 has a length in the first bond pad array direction less than the pitch of the dielectric bumps 15a. Referring to FIG. 14, the unmasked metal layer and unmasked UBM layer are finally removed.

Figure 15:
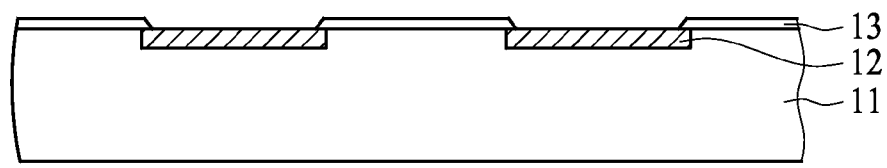
FIGS. 15 to 18 are cross-sectional views showing formation of a bump structure according to another exemplary embodiment of the present disclosure.

FIGS. 15 to 18 are cross-sectional views showing formation of a bump structure 1c according to another embodiment of the present disclosure. As shown in FIG. 15, a first substrate 11 is initially provided. Next, a plurality of first bond pads 12 are formed on the first substrate 11 in a well-spaced distribution. Next, a passive layer 13 is formed to surround each first bond pad 12.

Figure 16:
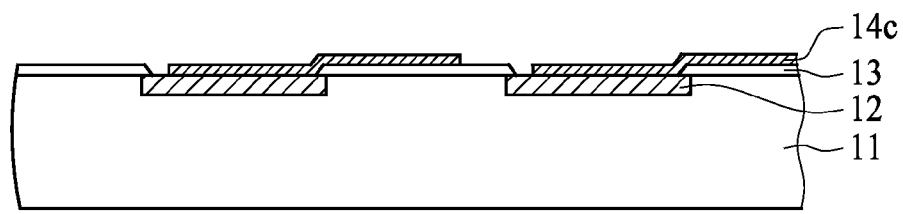
Figure 17:
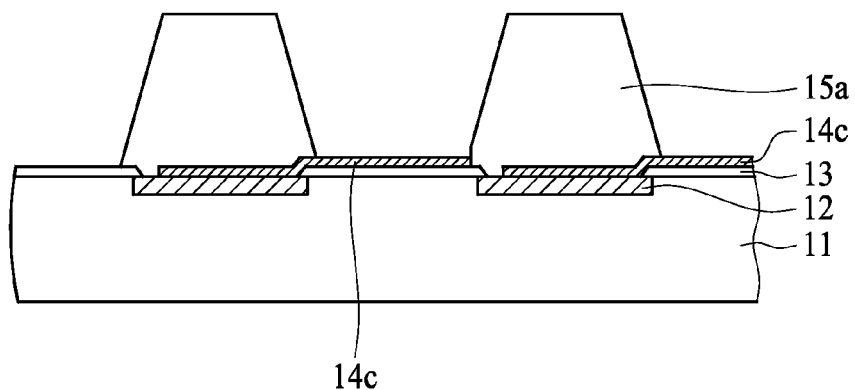
Figure 18:
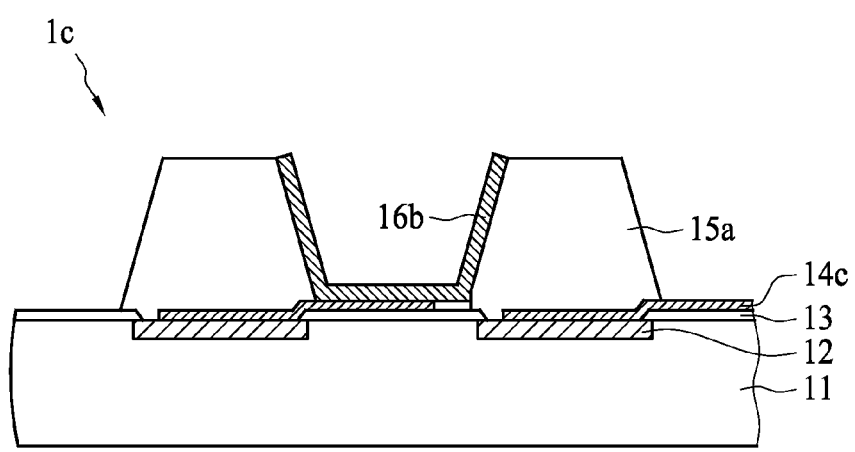

Referring to FIG. 16, a plurality of UBM layers 14c are formed with respect to the plurality of first bond pads 12, wherein the plurality of UBM layers 14c are electrically isolated from each other. Referring to FIG. 17, a plurality of dielectric bumps 15a are formed correspondingly on the plurality of UBM layers 14c, wherein a portion of each UBM layer 14c is between an adjacent two of the dielectric bumps 15a, and another portion of the UBM layer 14c is covered by the respective dielectric bump 15a. Referring to FIG. 18, a metal layer is then formed on the plurality of dielectric bumps 15a and the exposed UBM layer 14c. Finally, the portion of the metal layer on the top of the dielectric bumps 15a is removed to obtain the final metal layer 16b.

Figure 19:
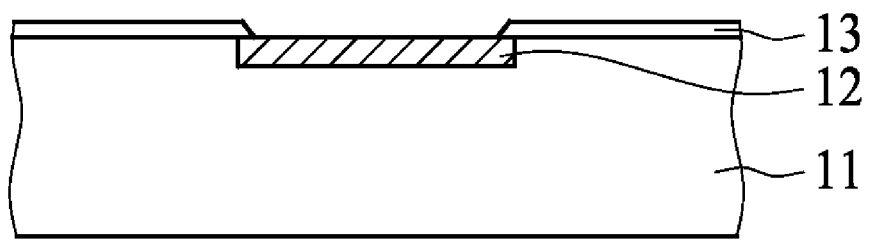
FIGS. 19 to 21 are cross-sectional views showing formation of a bump structure according to another exemplary embodiment of the present disclosure.
Figure 20:
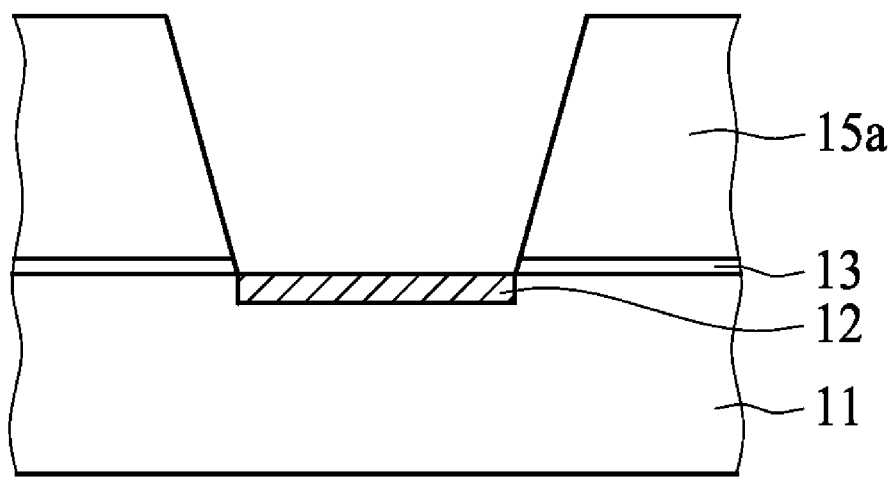
Figure 21:
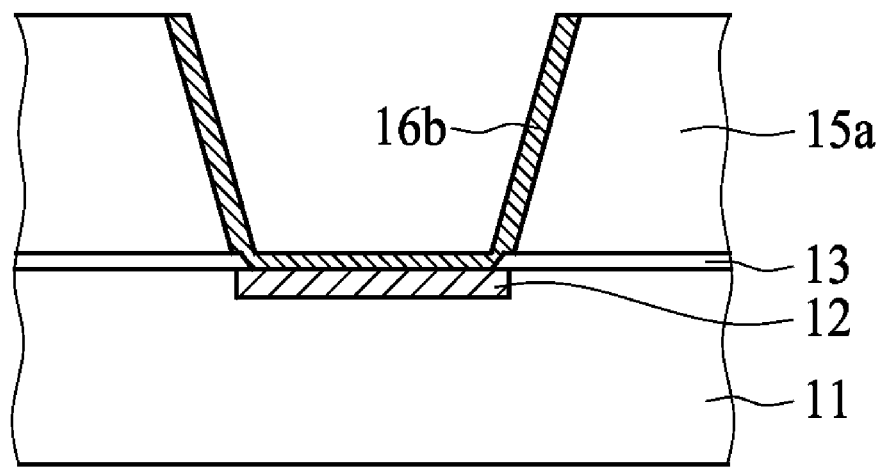

FIGS. 19 to 21 are cross-sectional views showing formation of a bump structure 1d according to another embodiment of the present disclosure. As shown in FIG. 19, a first substrate 11 is provided, and a plurality of first bond pads 12 are formed on the first substrate 11 in a well-spaced distribution. Next, a passive layer 13 is formed to surround each first bond pad 12. Referring to FIG. 20, a plurality of dielectric bumps 15a are formed on the first substrate 11, wherein the plurality of first bond pads 12 are correspondingly formed between the plurality of dielectric bumps 15a.

Referring to FIG. 21, a metal layer is then formed on the plurality of dielectric bumps 15a and the plurality of first bond pads 12. Next, the portion of the metal layer on the tops of the dielectric bumps 15a is removed to obtain the final metal layer 16b.

Figure 22:
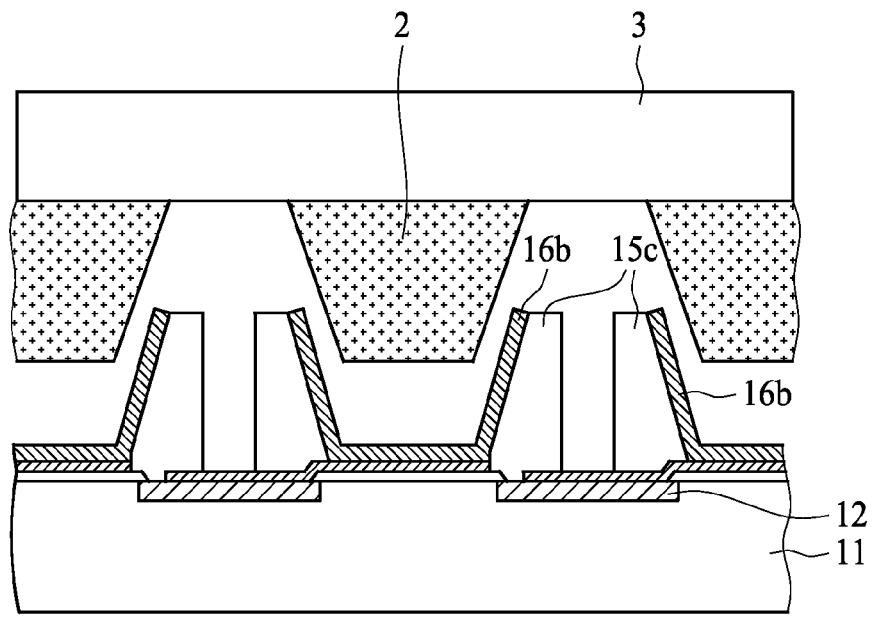
FIG. 22 is a cross-sectional view showing a bump structure and second bond pads on a second substrate according to one exemplary embodiment of the present disclosure.
Figure 23:
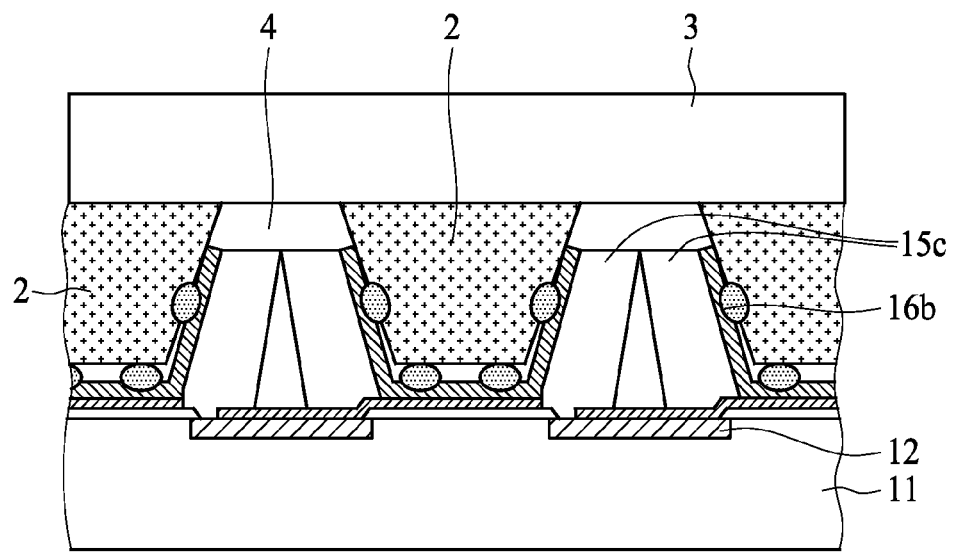
FIGS. 23 and 24 are cross-sectional views showing the bonding of the second bond pads on the second substrate to the bump structure in FIG. 22.
Figure 24:
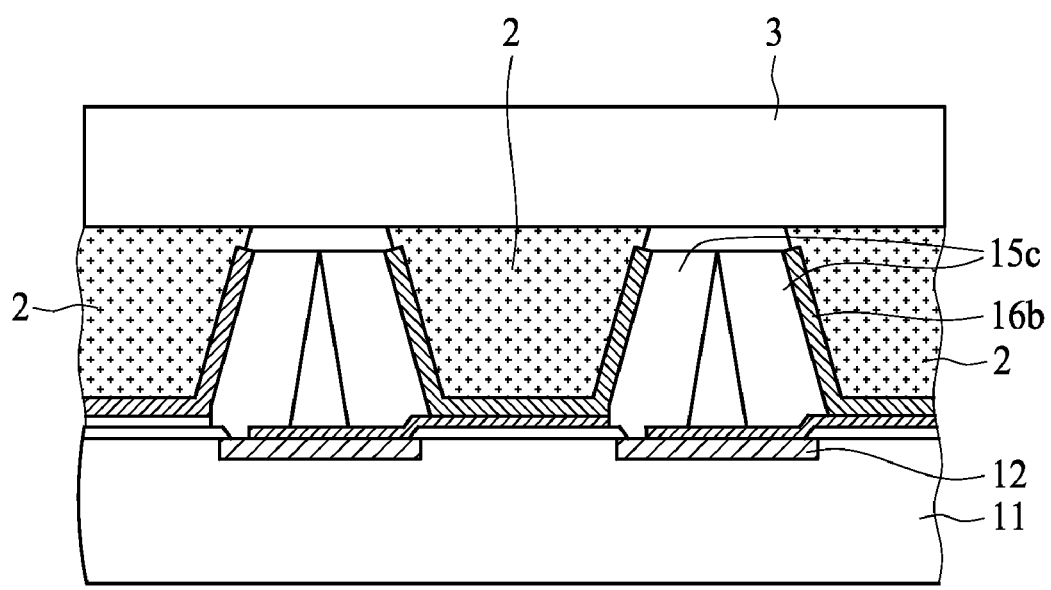

FIG. 22 is a cross-sectional view showing a bump structure 15c and second bond pads on a second substrate according to one embodiment of the present disclosure, and FIGS. 23 and 24 are cross-sectional views showing the bonding of the second bond pads on the second substrate of FIG. 22 to the bump structure 15c of FIG. 22. Referring to FIGS. 22 to 24, each dielectric bump 15c can be divided into two pieces so that the dielectric bump 15c can easily deform. Accordingly, when the second bond pads 2 are bonded, the second bond pads 2 and the metal layers 16b can be firmly attached. Each dielectric bump 15c is divided into two pieces along a direction transverse to an arrayed direction of the plurality of the first bond pads 12. The separation method may include an etching process. The divided dielectric bump 15c can be more flexible, and can be used for chip packages bonded using an anisotropic conductive adhesive as shown in FIG. 23 or chip packages bonded using a non-conductive adhesive as shown in FIG. 24.

In the above-mentioned embodiments, the dielectric bump 15a or 15b can be a polymer bump, for example a polyimide bump. The dielectric bump 15a or 15b includes a hexahedral shape, a cylindrical shape, or a polyhedral shape. The first substrate 11 can be a silicon substrate. The material of the bond pads 2 and 12 can be gold, copper or aluminum. The material of the metal layer 16a, 16b, and 18 can be gold. The material of the second substrate 3 can be a glass substrate, a polymer substrate, a silicon substrate or a ceramic substrate.

The above-described embodiments of the present disclosure are intended to be illustrative only. Numerous alternative embodiments may be devised by persons skilled in the art without departing from the scope of the following claims.

We claim:

1. A bump structure, comprising:
a first substrate;
a plurality of first bond pads disposed on the first substrate;
a plurality of dielectric bumps disposed corresponding to the first bond pads, wherein the plurality of dielectric bumps are formed on the respective first bond pads, wherein each of said plurality of dielectric bumps is disposed directly above the respective first bond pad;
a plurality of under bump metal layers each correspondingly formed between the first bond pad and the dielectric bump, extending through a side surface of the respective dielectric bump, and forming an extension portion between an adjacent two of the dielectric bumps, wherein each extension portion has a length along the extending direction thereof shorter than a pitch between the dielectric bumps; and
a plurality of metal layers each formed on the surface of the respective dielectric bump and the respective extension portion.

2. The bump structure of claim 1, wherein the dielectric bump comprises a polymer bump.

3. The bump structure of claim 1, wherein the dielectric bump includes a hexahedral shape, a cylindrical shape, a polyhedral shape, or a round bump.

4. The bump structure of claim 1, wherein the first substrate comprises a silicon substrate.

5. The bump structure of claim 1, wherein the material of the first bond pad is gold, copper or aluminum.

6. The bump structure of claim 1, wherein the material of the metal layer is gold.

7. A chip package structure, comprising:
a first substrate;
a plurality of first bond pads disposed on the first substrate;
a plurality of dielectric bumps disposed corresponding to the first bond pads, wherein the plurality of dielectric bumps are formed on the respective first bond pads;
a plurality of under bump metal layers each correspondingly formed between the first bond pad and the dielectric bump, extending through a side surface of the respective dielectric bump, and forming an extension portion between an adjacent two of the dielectric bumps, wherein each extension portion has a length along the extending direction thereof shorter than a pitch between the dielectric bumps; and
a plurality of metal layers each formed on the side surface of the respective dielectric bump and the respective extension portion;
a second substrate;
a plurality of second bond pads disposed on the second substrate with respect to the first bond pads, wherein the second bond pad is configured to protrude between the two adjacent dielectric bumps; and
a conductive adhesive including a plurality of conductive particles, the conductive adhesive being disposed between the first substrate and the second substrate, wherein a portion of the conductive particles are trapped between the second bond pads and the metal layers.

8. The chip package structure of claim 7, wherein each dielectric bump is disposed directly above the respective first bond pad.

9. The chip package structure of claim 7, wherein the dielectric bump comprises a polymer bump.

10. The chip package structure of claim 7, wherein the dielectric bump includes a hexahedral shape, a cylindrical shape, a polyhedral shape, or a round top.

11. The chip package structure of claim 7, wherein the first substrate comprises a silicon substrate.

12. The chip package structure of claim 7, wherein the material of the first bond pad is gold, copper or aluminum.

13. The chip package structure of claim 7, wherein the material of the metal layer is gold.

* * * * *